(12) United States Patent
Anzagira et al.

(10) Patent No.: US 10,840,291 B2
(45) Date of Patent: Nov. 17, 2020

(54) MULTI-JUNCTION PIXEL IMAGE SENSOR WITH DIELECTRIC REFLECTOR BETWEEN PHOTODETECTION LAYERS

(71) Applicant: TRUSTEES OF DARTMOUTH COLLEGE, Hanover, NH (US)

(72) Inventors: Leo Anzagira, Hanover, NH (US); Eric R. Fossum, Wolfeboro, NH (US)

(73) Assignee: Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 16/231,987

(22) Filed: Dec. 25, 2018

(65) Prior Publication Data
US 2019/0371852 A1    Dec. 5, 2019

Related U.S. Application Data

(63) Continuation of application No. 15/545,958, filed as application No. PCT/US2016/014784 on Jan. 25, 2016, now Pat. No. 10,163,968.

(60) Provisional application No. 62/107,312, filed on Jan. 23, 2015.

(51) Int. Cl.
*H01L 29/12* (2006.01)
*H01L 27/146* (2006.01)

(52) U.S. Cl.
CPC .... *H01L 27/14647* (2013.01); *H01L 27/1464* (2013.01); *H01L 27/14621* (2013.01); *H01L 27/14623* (2013.01); *H01L 27/14629* (2013.01); *H01L 27/14634* (2013.01); *H01L 27/14645* (2013.01)

(58) Field of Classification Search
CPC ......... H01L 27/14645; H01L 27/14647; H01L 27/14621; H01L 27/14629
USPC .......................................................... 257/43
See application file for complete search history.

(56) References Cited

U.S. PATENT DOCUMENTS

| | | | | |
|---|---|---|---|---|
| 7,129,979 | B1 * | 10/2006 | Lee ................... | H01L 27/14603 348/308 |
| 9,712,792 | B2 * | 7/2017 | Shi ........................ | H04N 9/045 |
| 2010/0026865 | A1 * | 2/2010 | Tivarus ............. | H01L 27/14647 348/308 |
| 2010/0118172 | A1 * | 5/2010 | McCarten ......... | H01L 27/14621 348/302 |

\* cited by examiner

*Primary Examiner* — David S Blum
(74) *Attorney, Agent, or Firm* — David V. Rossi; Haug Partners LLP

(57) ABSTRACT

Some embodiments provide a color image sensor and color image sampling method that uses multiple-layer pixels and is capable of producing color images without using absorption color filters (e.g., such as employed in conventional CFAs). In accordance with some embodiments of the color image sensor device and color image sampling method, frequency-dependent reflectors are incorporated between the photodetection layers of multiple-layer (e.g., two layer) pixels.

20 Claims, 8 Drawing Sheets

PIXEL WITH 450nm DBR

PIXEL WITH 650nm DBR

MULTI-JUNCTION PIXEL IMAGE SENSOR WITH DIELECTRIC REFLECTOR BETWEEN PHOTODETECTION LAYERS

RELATED APPLICATIONS

This application is a continuation of Application No. 15/545,958, now issues as U.S. Pat. No. 10,163,968, which is a national stage application under 35 U.S.C. § 371 of International Application No. PCT/US2016/014784, filed Jan. 25, 2016, which claims the benefit of U.S. Provisional Application No. 62/107,312, filed Jan. 23, 2015, each of which is hereby incorporated herein by reference in its entirety.

BACKGROUND

The present disclosure relates generally to apparatus and methods for image sensing, and, more particularly, to a color image sensor comprising pixels having multiple photodetection layers for reproducing color without the need for conventional absorption color filter arrays.

CMOS image sensors have seen tremendous improvement in performance, especially under optimal illumination conditions. But, for low light applications, there is still much room left for improvement, despite the emergence of technologies such as backside illumination and panchromatic filters. Sensors operating in light-starved conditions typically use monochrome sensors since they collect more photons. These sensors are also able to incorporate near-infrared to further increase the collected signal. The lack of color however makes object detection and identification extremely difficult.

The use of absorption color filters is a major limiting factor to a color image sensor's low light performance. Primary color filter arrays typically transmit only about a third of the incident light, while complementary filter arrays tend to have a theoretical maximum transmittance of about two thirds of the incident light.

To make the most use of incident illumination, three pixel layers can be stacked vertically to sample different colors without the need for an absorption color filter as demonstrated by Foveon (see, e.g., U.S. Pat. No. 5,965,875 to Merrill). This is possible because light absorption in silicon is wavelength dependent. The increased complexity associated with implementing readout circuitry for each of the three junctions has limited the growth of this technology. Other challenges such as increased noise, lag and reduced fill factor have hampered the use of this concept for low light imaging.

A compromise which has been explored quite extensively is to stack two pixel layers to reduce the readout complexity and still leverage the wavelength dependent absorption for color sampling. Each pixel outputs two color samples which is insufficient for full color reproduction. Several implementations of two-layer pixels therefore tend to use a color filter array (CFA) to vary the response of pixels in order to generate three or more color samples. See K. M. Findlater, "Buried double junction pixel using green and magenta filters," in IEEE Workshop on CCDs and Advanced Image Sensors, Japan, 1999; D. J. Tweet, J. J. Lee, J. M. Speigle and D. Tamburino, "2PFC image sensors: better image quality at lower cost," in IS&T/SPIE Electronic Imaging: Digital Photography V, 7250, 2009; see, also, U.S. Pat. No. 8,106,426 to Tweet, et al. It has been suggested that the use of Green and Magenta checkered filter pattern over the two layer pixels is optimum for both good color reproduction and high SNR (E. R. Fossum, "Investigation of Two-Layer Photodetectors for YSNR10 Improvement in Submicron Pixels," in *International Image Sensor Workshop*, Hokkaido, Japan, 2011. The use of color filters however reduces the light collected by the pixels. In order to maximize the light absorption to make these two-layer pixels useful for low light applications, an alternative color sampling method and device is required which eliminates the losses caused by absorption color filters.

SUMMARY OF SOME EMBODIMENTS

Some embodiments of the present disclosure provide a color image sensor device and color image sampling method that uses multiple-layer pixels and is capable of producing color images without using absorption color filters (e.g., such as employed in conventional CFAs). In accordance with some embodiments of the color image sensor device and color image sampling method, instead of using absorption color filter arrays as the primary means of varying the spectral responses of the photodetection layers, frequency-dependent reflectors are incorporated between the photodetection layers of multiple-layer (e.g., two layer) pixels. By selectively reflecting a portion of the visible light spectrum, each frequency-dependent reflector (FDR) alters the color response of the neighboring photodetection layers between which the frequency-dependent reflector is disposed along the direction of photon illumination of the image sensor. The frequency-dependent reflectors (FDRs) may be implemented as a distributed Bragg reflectors (DBRs).

For example, in accordance with some embodiments, the image sensor comprises a two-layer pixel that includes a frequency-dependent reflector disposed between top/upper and bottom/lower photodetection layers having respective top/upper and bottom/lower junctions (e.g., photodiode junctions), and wherein the frequency-dependent reflector is configured such that a selective spectral portion of light that is incident thereon through the top/upper photodetection layer is substantially reflected by the frequency-dependent reflector into the top/upper photodetection layer, and the light incident thereon through the top/upper photodetection layer that is not reflected by the frequency-dependent reflector is substantially transmitted to the bottom/lower photodetection layer.

In accordance with some embodiments of the present invention, an image sensor comprises an array of repeating pixel kernels such that each kernel includes two or more multi-junction (e.g., two-junction) pixels. The pixels in the kernel are designed such that at least one pixel in the kernel has a frequency-dependent reflector (FDR) such as a distributed Bragg reflector (DBR) so the pixels in a kernel produce three or more color samples.

By way of non-limiting example, the image sensor may be, for example, a conventional CMOS image sensor (e.g., configured to operate in charge integration mode, with a single integration period per pixel per frame), a digital integration sensor (DIS), a quantized DIS (qDIS), or a Quanta Image Sensor (QIS). In some embodiments, the pixels may be sub-diffraction limit pixels, which in some implementations may be jots. The image sensor may include an array of microlens elements, and, in various alternative embodiments, one or more pixels in each kernel of the pixel array may include an overlying absorption color filter, although absorption color filters may not be required—and are not employed—in some embodiments of a multi junction color image sensor.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein:

FIG. 4 depicts a top plan view of a portion of an illustrative color filter array pattern based on a Bayer pattern, in accordance with some embodiments of the present invention;

FIG. 5 depicts an illustrative alternative implementation of the color filter array pattern of FIG. 3, in accordance with some embodiments of the present invention;

FIG. 6 depicts an illustrative embodiment corresponding to the color filter array of FIG. 5 transformed such that adjacent color filter elements having the same color are implemented as a continuous color filter region, in accordance with some embodiments of the present invention;

DETAILED DESCRIPTION OF SOME EMBODIMENTS

Figure 1:
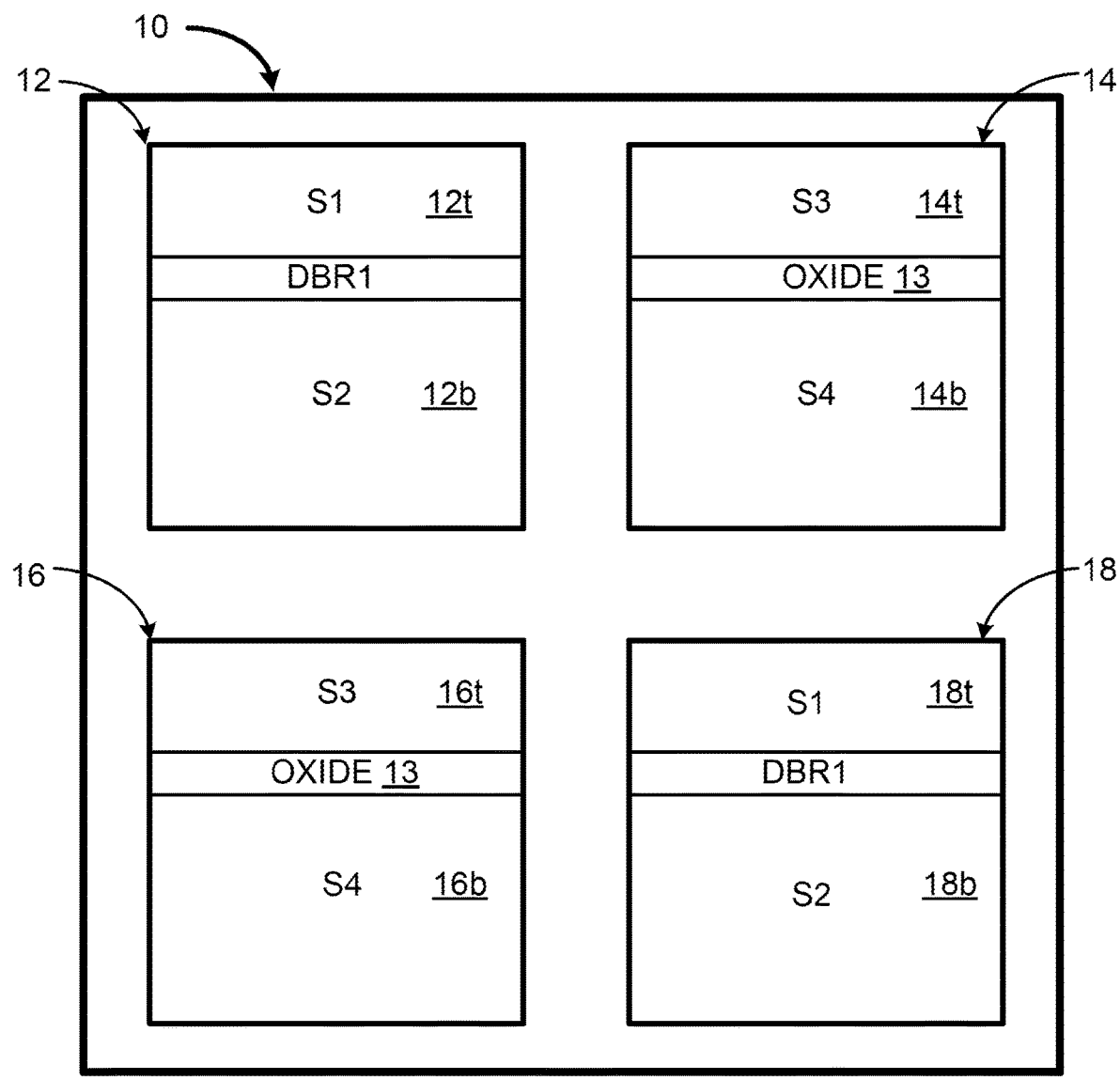
FIGS. 1-4 each schematically depicts a kernel of a color image sensor, in accordance with respective illustrative embodiment.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. Similarly, the phrase "some embodiments" as used herein at different instances does not necessarily refer to the same "some embodiments," though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

The terms "color filter," "color filter element," or similar terms, are used herein in accordance with their ordinary and customary meaning to those skilled in the art, in accordance with the context in which these terms are used. For example, a conventional color filter, conventional CFA, or absorption color filter, or similar terms in context, may be understood to refer to, for example, a component (e.g., a material layer) that selectively transmits light within a certain range of wavelengths (e.g., corresponding to a portion of the color spectrum), the color filter thus having a wavelength-dependent transmission characteristic such that it transmits light within the certain range of wavelengths (sometimes referred to as the "passband"), while substantially absorbing light having wavelengths (or color) outside of the passband.

For clarity, it is noted that the term "kernel" (or similarly, "unit kernel"), as used herein, refers to a minimal repeating pattern of pixels comprising at least one multi junction pixel (and associated at least one FDR) that is two-dimensionally replicated over the full extent of the color filter array.

As used herein, with respect to the image plane (e.g., corresponding to a plan view of an image sensor), two pixel elements (e.g., multilayer pixel elements) are "adjacent" or "neighboring" if they are disposed near each other without any intervening pixels. In addition, as used herein with respect to the image plane (e.g., corresponding to a plan view of an image sensor), the term "nearest neighbor" with respect to any given pixel in a pixel array refers to an adjacent pixel having a minimum distance to the given pixels as may be measured along a line between corresponding points on the adjacent and given pixels, in accordance with the ordinary and customary meaning of "nearest neighbor" in the context of arrays, as understood by those skilled in the art. Similarly, as used herein with respect to the image plane (e.g., corresponding to a plan view of an image sensor), the term "next-nearest-neighbor" with respect to any given pixel in a pixel array refers to an adjacent pixel having the next-shortest distance (greater than the minimum distance) to the given pixel as may be measured along a line between corresponding points on the adjacent and given pixels, in accordance with the ordinary and customary meaning of "next-nearest-neighbor" in the context of arrays, as understood by those skilled in the art. It may be understood, for example, that a given pixel may have more than one nearest neighbor as well as more than one next-nearest-neighbor.

Further, as used herein with respect to the image plane (e.g., corresponding to a plan view of an image sensor), it will be understood that for ease of reference and clarity of exposition with respect to a regular, rectangular (e.g., square) array, having elements arranged in a row/column configuration, the terms "vertical" and "horizontal" will be used herein to refer to orthogonal directions between nearest neighbor color elements, whereas "diagonal" will be used herein to refer to the direction between next-nearest-neighbor color elements. While these terms may reflect the perspective of the referenced figures on the page and/or conventional reference to image sensor pixel arrays with respect to readout circuitry, it is understood that no preferred orientation is implied by such nomenclature; e.g., "row" and "column" designations are interchangeable, as are "horizontal" and "vertical" designations.

Similarly, it will be understood that simply for ease of reference and clarity of exposition with respect to a multilayer pixel, terms such as "upper," "top," "lower," and "bottom," with reference to a layer, junction or other structure refers to a relative spatial position with respect to a primary direction along which that the image sensor is configured to have incident light impinge thereon for image sensing, wherein "upper" and/or "top" refers to a position disposed closer to the source of the incident illumination than a position referred to by "lower" and/or "bottom." As such, light incident on the image sensor will impinge on a "top" or "upper" junction/layer before possibly (e.g., if not absorbed by the top or upper junction/layer) impinging on a "lower" or "bottom" junction/layer. In this regard, it may also be understood, in context, that with respect to a given multi junction pixel, a "top" or "upper" junction of the pixel overlies a "bottom" or "lower" junction along the light incidence direction. It will be understood, however, that such terms may not have a relation to terms such as "frontside" or "backside" with respect to the surface of the image sensor's wafer/substrate that is configured to be illuminated. For instance, a multi junction image sensor may comprise a "top" junction and a "bottom" junction, wherein the "top" junction is formed in a wafer/substrate that is backside-illuminated. It is understood, therefore, as noted, that the "top," "upper," "bottom," "lower" terminology as used herein is a convention simply for convenience and ease of reference with respect to referring to different layers, and does not otherwise impart any limitation on the overall design and/or orientation of a multi-layer color image sensor in accordance with the present disclosure. Also, for ease of reference, as used herein with respect to overlying (e.g., stacked) pixels or junctions of a multilayer pixel, two such pixels or junctions may be referred to as being "adjacent" if they do not include an intervening junction or pixel corresponding to the multilayer pixel.

The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but may be based on, for example, silicon-germanium, germanium, or gallium arsenide.

In addition, as will be understood by those skilled in the art in view of the ensuing disclosure, because each multi junction pixel comprises at least two junctions from which separate color sample signals may be accumulated and readout of the image sensor, each multi-junction pixel may be referred to as having more than one pixel, regardless of whether shared readout is employed among the pixels of a given multi junction pixel. For example, a two-layer pixel having two junctions (e.g., an upper junction and lower junction) may be referred to as having an upper pixel and lower pixel, regardless of whether the upper and lower pixel have entirely independent readout circuitry (e.g., transfer gate, reset gate, floating diffusion region, source-follower amplifier, and row-select transistor) or readout circuitry (e.g., floating diffusion, and/or reset gate, etc.).

Referring now to FIGS. 1-4, shown in each of these figures is a schematic block representation of a respective illustrative image sensor kernel 10 comprising multi-layer pixels 12, 14, 16, and 18, wherein the kernel 10 incorporates at least one FDR for varying the color response of the upper and lower pixels of at least one multilayer pixel, in accordance with some embodiments. In these illustrative embodiments, each kernel 10 comprises four two-layer pixels, wherein the two-layer pixels are arranged in a 2×2 array.

More specifically, for clarity of exposition, FIGS. 1*a-c* schematically represent an image sensor kernel in a hybrid plan-view and cross-sectional view: multi-layer pixels 12, 14, 16, and 18 are depicted relative to each other in a plan view of the kernel; and each multi-layer pixel 12, 14, 16, and 18 are schematically depicted in cross-sectional view to show respective upper layers 12*t*, 14*t*, 16*t*, 18*t*, respective lower layers 12*b*, 14*b*, 16*b*, 18*b*, and intervening layers, which may comprise an FDR (e.g., shown as DBRs DBR1, DBR2, DBR3, and DBR4), or a uniform dielectric layer (e.g., oxide 13). In FIGS. 1-4, color samples associated with photoconversion in upper and lower layers are identified by references S1, S2, S3, S4, S5, S6, S7, and S8, wherein different pixels of a given kernel that are configured to provide the same color sample are denoted by identical color sample reference characters, and wherein different pixels of a given kernel that are configured to provide different color samples are denoted by different color sample reference characters. Similarly, it will be understood that like referenced DBRs and oxide layers indicate common layers having common properties (e.g., reflectivity, transmittance, etc.) with respect to providing color samples in the respective adjacent upper and lower pixels.

Accordingly, in some embodiments such as schematically depicted in FIGS. 1-4, an FDR is included between the top and bottom junctions of at least one pixel in a kernel of the image sensors array so as to vary the spectral sensitivity without using color filter arrays. In such a pixel, a portion of the visible light spectrum is reflected, thus making two passes through the top layer (e.g., layers 12*t*, 14*t*, 16*t*, 18*t*) and increasing its absorption in that layer. Consequently, the absorption of that part of the spectrum in the bottom layer (e.g., 12*b*, 14*b*, 16*b*, 18*b*) is decreased. This configuration incorporating an intervening FDR modifies (e.g., compared to not using an intervening FDR) the responses of the two (upper and lower) junctions, thus producing different color samples than the original two layer pixels.

It will thus be understood that in FIG. 1, two two-layer pixels 12 and 18 have a common DBR stack DBR1 between their top and bottom junctions while the other two two-layer pixels 14 and 16 have an intervening oxide 13 (e.g., or, in some embodiments, some other insulating dielectric) between upper and lower junctions. Accordingly, four different spectral (color) samples S1, S2, S3, and S4 are produced by such a kernel.

Figure 2:
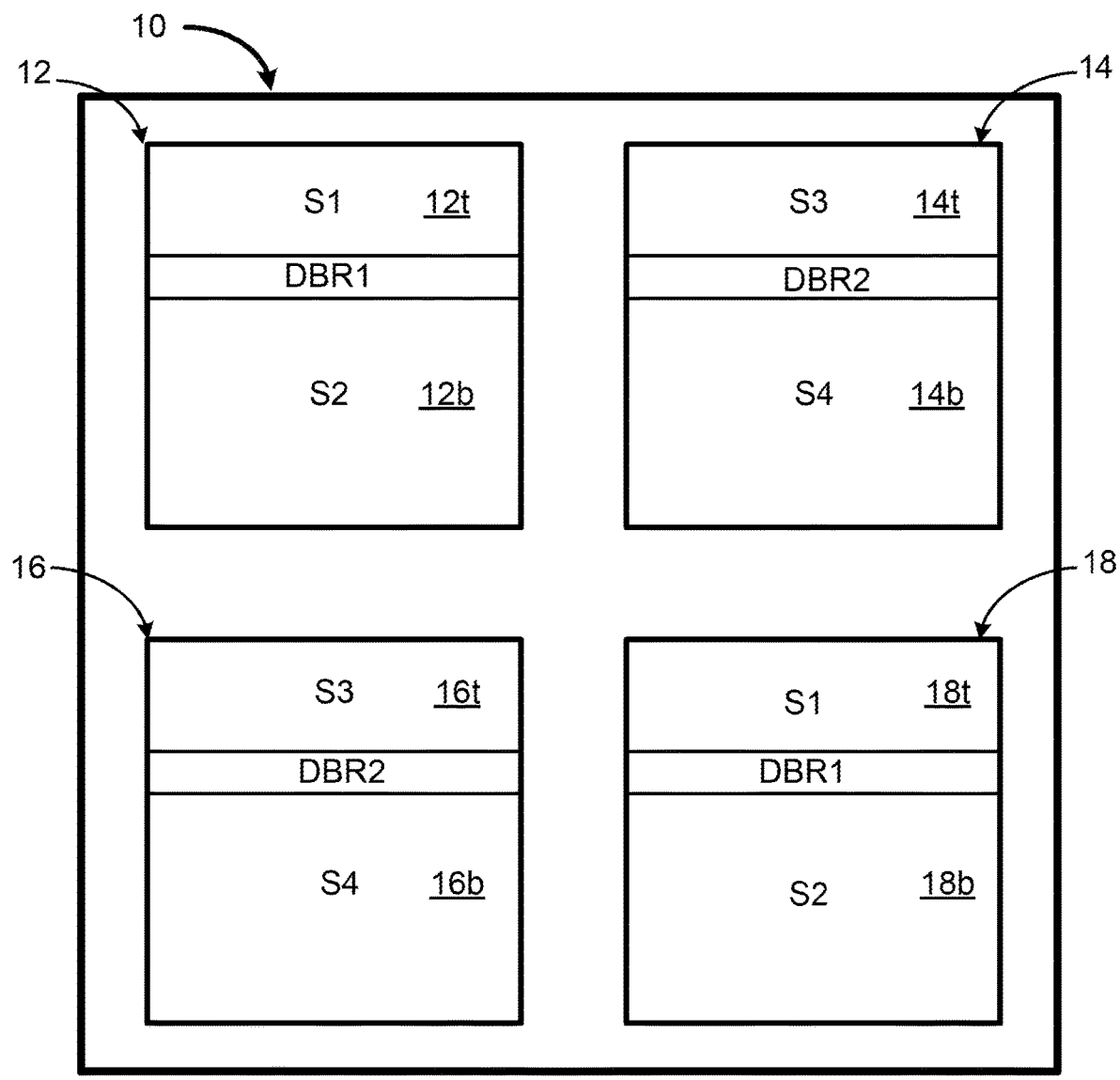
Figure 3:
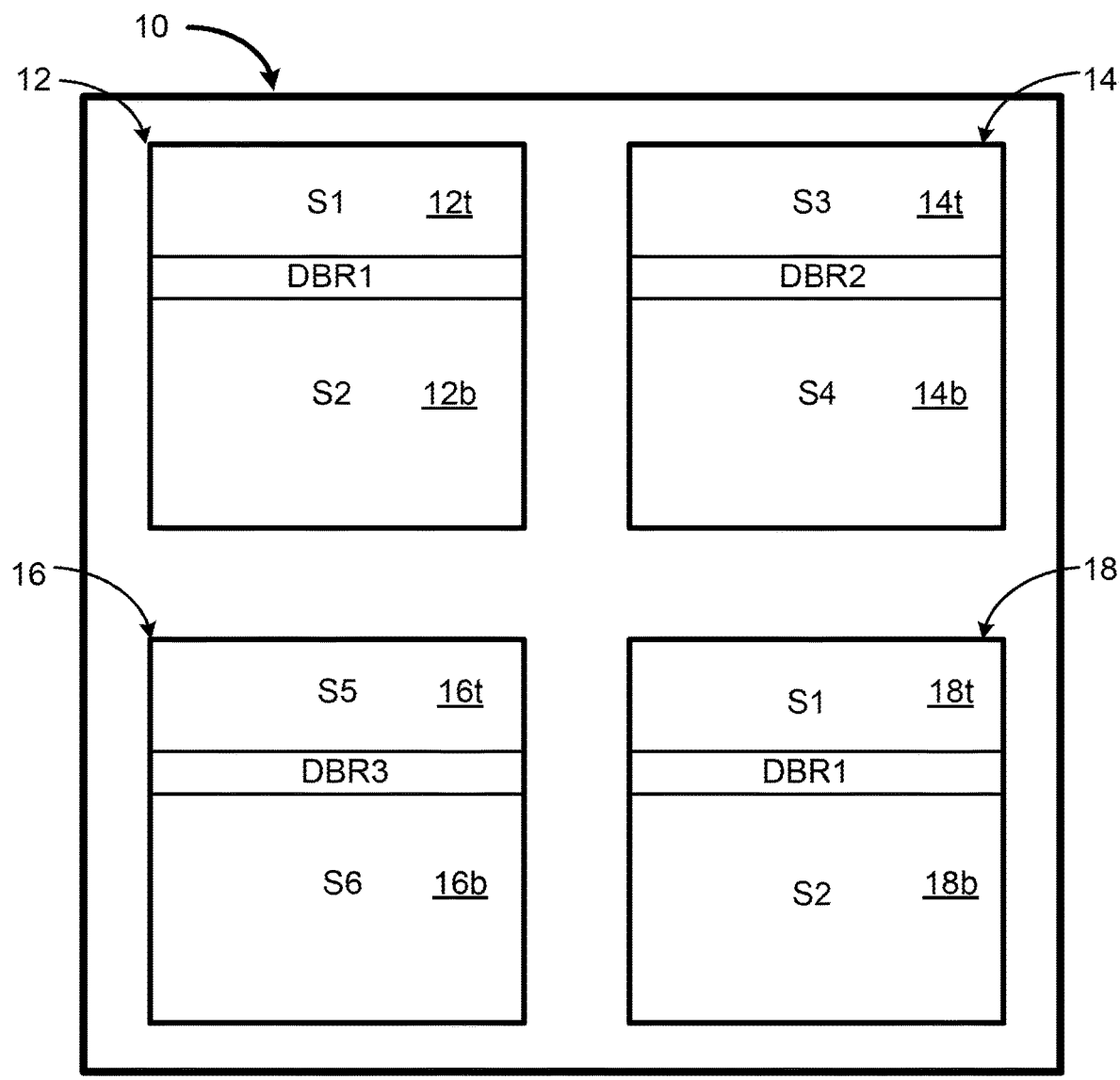
Figure 4:
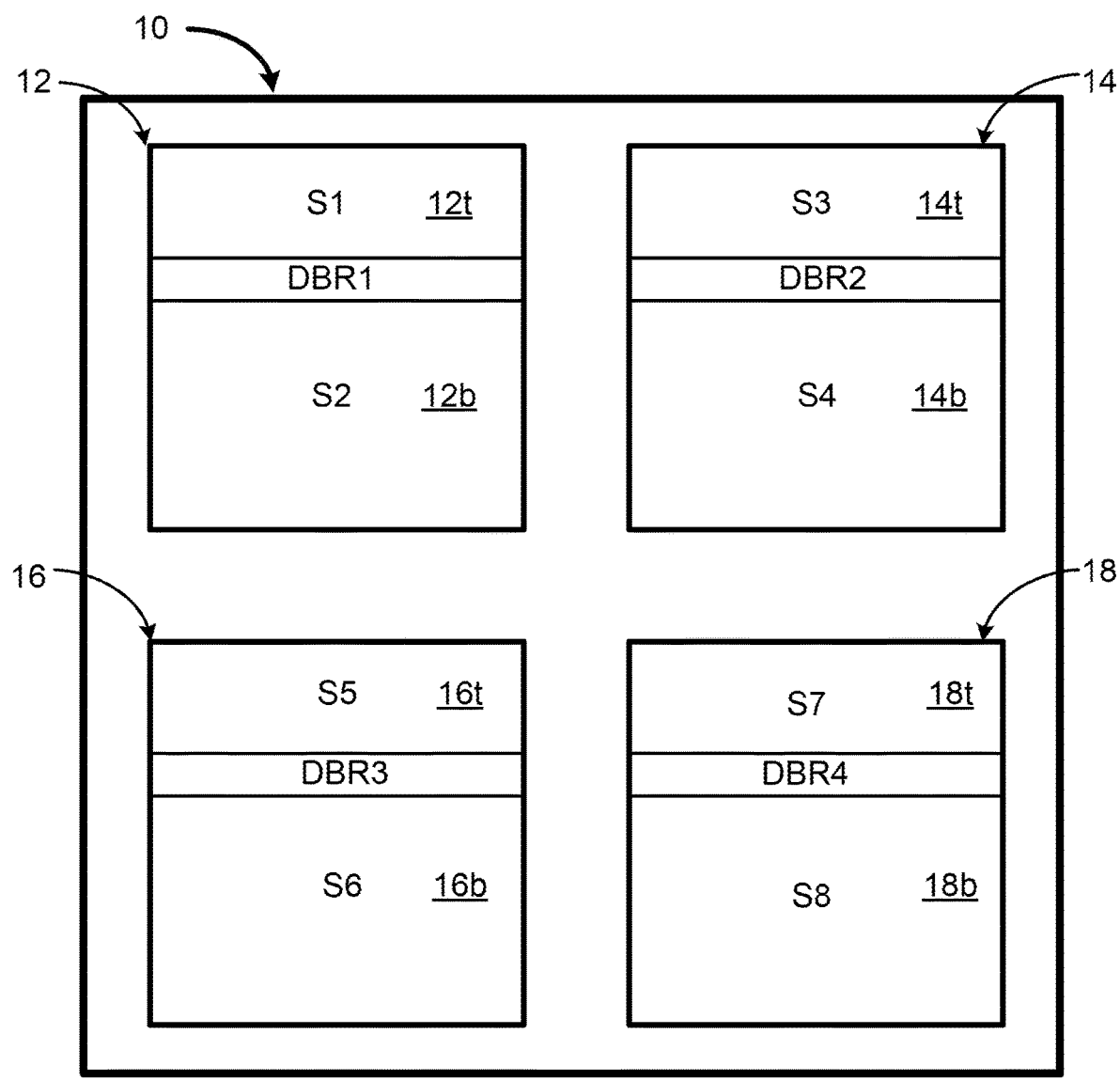

In FIG. 2, the four two-layer pixel kernel has (i) two two-layer pixels 12 and 18 that incorporate a common DBR layer DBR1 having a maximum reflectance at a first wavelength (e.g., 500 nm), and (ii) two-layer pixels 14 and 16 that incorporate another DBR layer DBR2 having a maximum reflectance at a different wavelength (e.g., 650 nm). Like the kernel of FIG. 1, this configuration similarly produces four color samples S1, S2, S3, and S4 (which, as will be understood, are not necessarily the same color samples as in the kernel of FIG. 1).

In some embodiments, more than 2 different DBRs can be incorporated in a kernel to increase the number of color samples. For example, kernel 10 of FIG. 3 includes three different DBRs, namely, DBR1, DBR2, DBR3, to provide six color samples S1, S1, S3, S4, S5, and S6. And in the illustrative embodiment of FIG. 4, the kernel 10 includes four different DBRs, namely, DBR1, DBR2, DBR3, DBR4, to provide eight color samples S1-S6, S7, and S8.

As will be understood in view of the present disclosure, each of some embodiments of the present invention allows for a number of parameters to be used to optimize color quality and SNR of the image sensor. Since the pixel response depends on the junction depth as well as the reflectance bandwidth, maximum reflectance, and wavelength of maximum reflectance of the reflector, these parameters can be used as optimization variables to improve SNR and color quality.

In some embodiments, a DBR may be used as a wavelength dependent reflector, such as described above. For example, the DBR may comprise alternating quarter wavelength films of high and low refractive index material. High reflectivity is obtained by constructive interference of electromagnetic waves reflected at interfaces between repeating layers of high and low refractive index materials. As will be understood by those skilled in the art, all interfaces preferably should be parallel for constructive interference, in accordance with some embodiments. The maximum reflectance of a DBR stack is dependent on the refractive index ratio between the high and low index materials as well as the number of layers in the stack. This maximum reflectance is given by $$R_{max} = \left( \frac{1 - \left(\frac{n_f}{n_i}\right)\left(\frac{n_H}{n_L}\right)^{2N}}{1 - \left(\frac{n_f}{n_i}\right)\left(\frac{n_H}{n_L}\right)^{2N}} \right)^2$$

where $n_i$ and $n_f$ are the refractive indices of the incident medium from which the light arrives at the DBR and the substrate into which transmitted light from the DBR emerges respectively. $n_H$ and $n_L$ are the high and low refractive indices respectively and N is the number of layer pairs in the stack.

Figure 5:
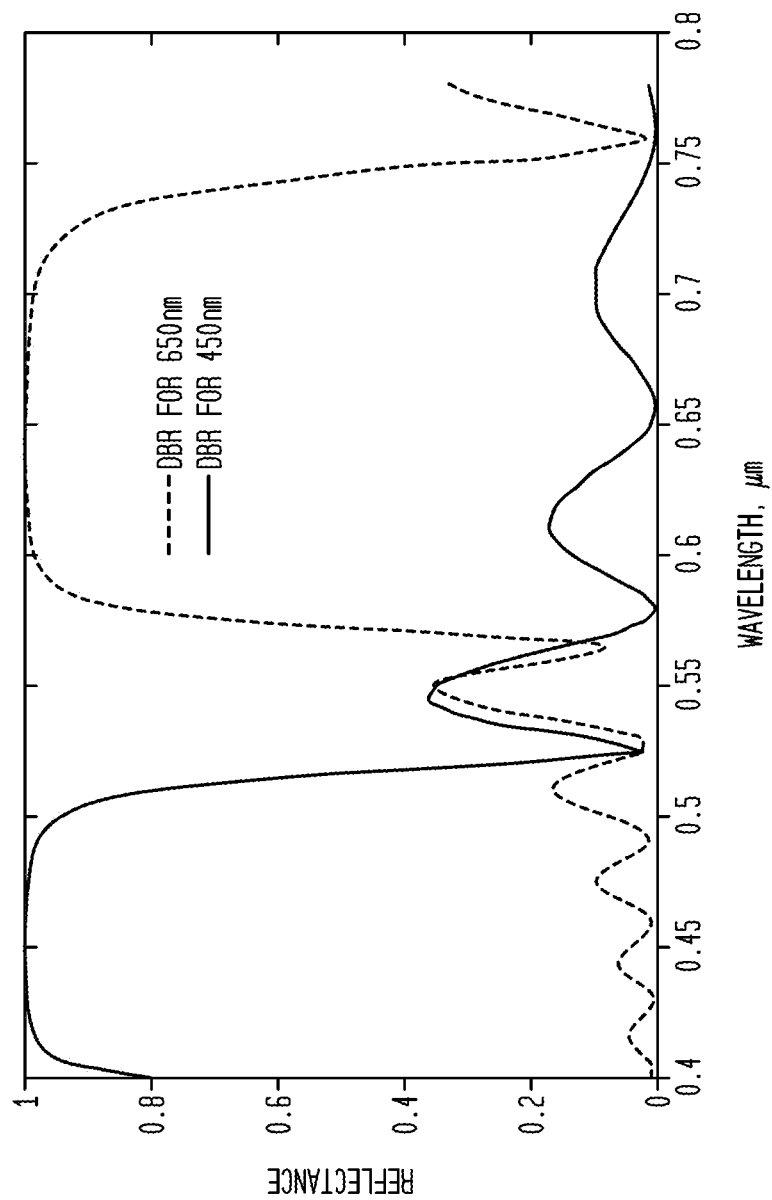
FIG. 5 is a simulation of the transmittances of two sample DBRs consisting of quarter wavelength films of silicon oxide (SiO2) and silicon nitride (Si3N4) and designed for center wavelengths of 450 and 650 nm, in accordance with some embodiments of the present invention.

The width of the stop band of the DBR is also determined by the refractive index ratio of the two layers and is given by the following relation:

$$\Delta\lambda = \frac{4}{\pi} \sin^{-1}\left(\frac{n_H - n_L}{n_H + n_L}\right) \cdot \lambda_o$$

where $\lambda_o$ is the center wavelength. Shown in FIG. 5 is a simulation of the transmittances of two sample DBRs consisting of quarter wavelength films of silicon oxide ($SiO_2$) and silicon nitride ($Si_3N_4$) and designed for center wavelengths of 450 and 650 nm.

Figure 6A:
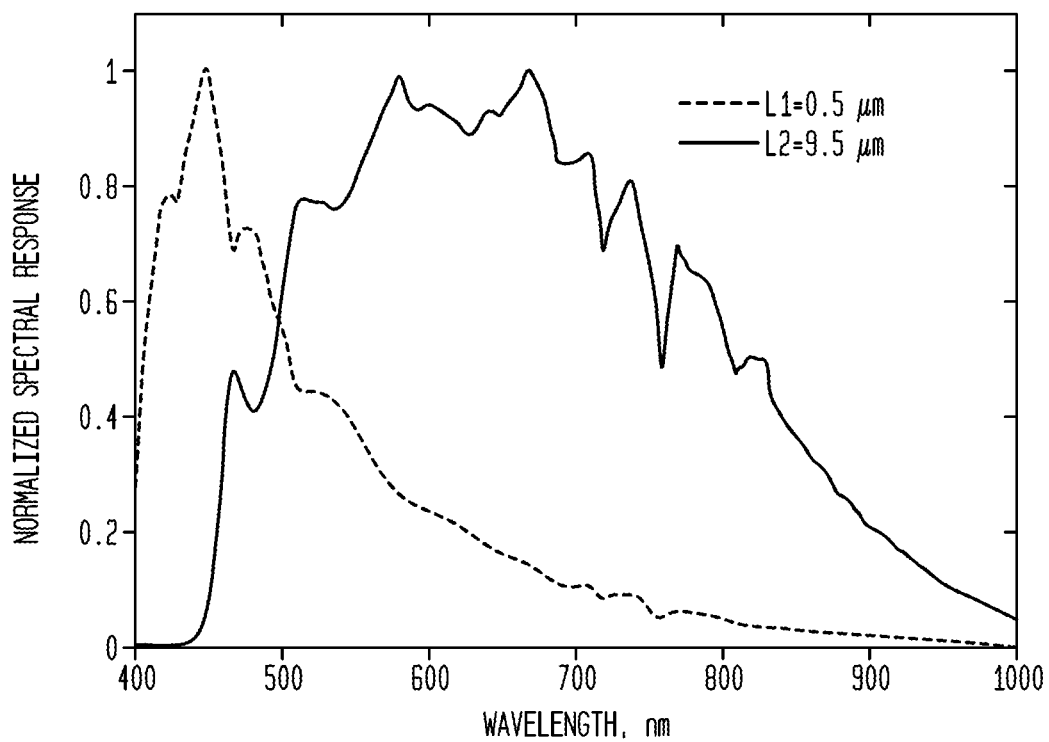
FIGS. 6A and 6B depict normalized spectral responses of two 2-layer pixels with two different DBRs designed for reflection at 450 nm and 650 nm, in accordance with some embodiments of the present invention.
Figure 6B:
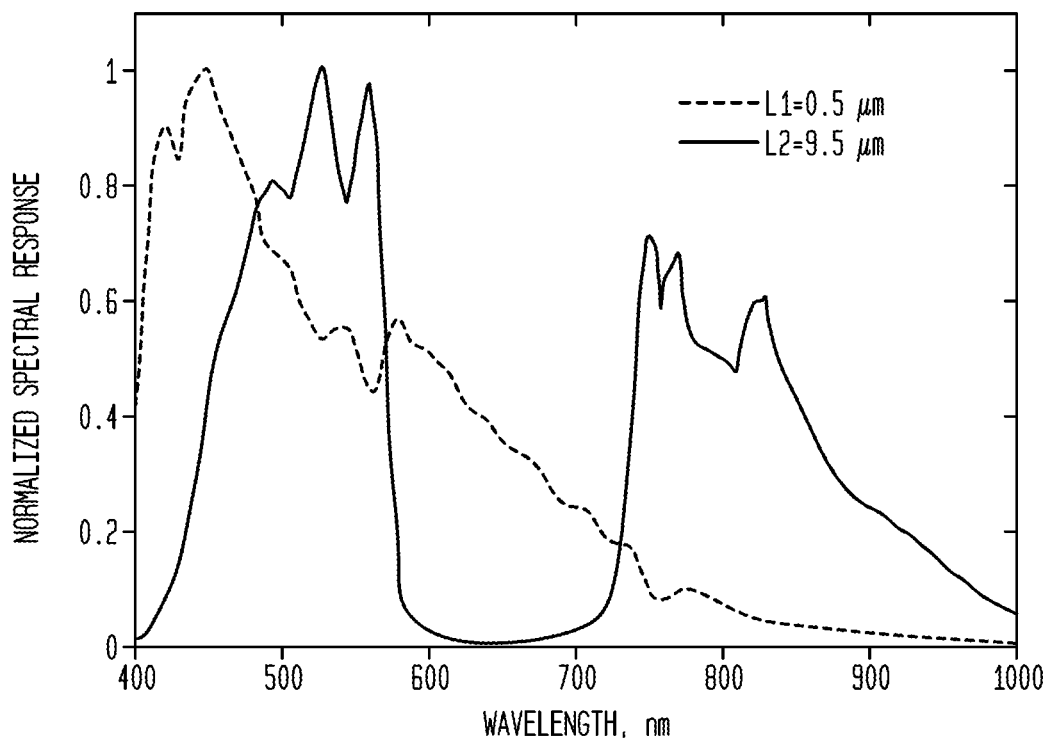

Shown, by way of example, in FIGS. 6A and 6B are the normalized spectral responses of two 2-layer pixels with two different DBRs designed for reflection at 450 nm and 650 nm. D65 illuminant was used in this simulation and the spectral response displayed is for the white color patch in the Macbeth color chart. Significantly different spectral responses are obtained for the top (L1) and bottom (L2) layers in each pixel. Also observe the spectral response for the L1 layers in the 700-1000 nm range is extremely small as a result of the large penetration depth of NIR light.

In some embodiments according to the present disclosure, similar frequency dependent reflectors/transmitters can be used in place of a DBR. Among these, for example, dielectric single and multiple cavity fabry-perot filters may be used. In fact, in accordance with some embodiments, by replacing the high or low refractive index layers at certain locations within a DBR stack, a "cavity" can be created effectively turning the DBR into a fabry-perot filter.

Implementing color image sensors in accordance with the present disclosure, such as in accordance with the foregoing illustrative embodiments, produces three or more color channel outputs, without requiring conventional color filters, in accordance with some embodiments. Since the color channel response will be significantly different from the standard color matching functions, implementations with greater than three color channel outputs typically will be more advantageous. Color reproduction errors after color correction depend on both the quality of basis functions (spectral sensitivity of channels) and the number of color channels. Increasing the number of channels or reducing the spectral overlap between the different channels or a combination of the two reduces the color reproduction error. The color quality specifications of the image sensor may therefore be met by optimizing the different design parameters including pixel junction depth and properties of the frequency dependent reflector.

In some embodiments, two layer pixels may be implemented on a single wafer by implanting junctions at different depths. This may require deeply implanted junctions which may use non-standard processes. Alternatively, in some embodiments, the bottom junction may be implanted first, and then an epitaxial layer can be grown over it for the implantation of the top junction. One drawback with this approach is that transfer of charge from the bottom junction may be very difficult, requiring large voltages. The signal red from these bottom junctions will be plagued by high KTC noise.

As an illustrative alternative to these methods, wafer bonding may be used such that the two different junctions are implanted on separate wafers, as for example disclosed in U.S. Patent Application Publication No. US2015/0090863 to Manoorian, et al., the contents of which are hereby incorporated by reference in its entirety. In some embodiments, the two different junctions may be implanted on the separate wafers complete with their respective read out chains, though some implementations may employ shared readout circuitry between pixels formed on the different wafers. The two wafers are then bonded such that one junction is directly located on top of the other. In some implementations, the reflector stack, may be located on either wafer. Backside illumination technique could be used on the top junction pixel to enhance performance. In such an implementation it would be preferable to deposit the reflector stack before the metallization layers to ensure minimal loss of reflected light as shown in the illustrative embodiment schematically structure depicted in FIG. 7.

Figure 7:
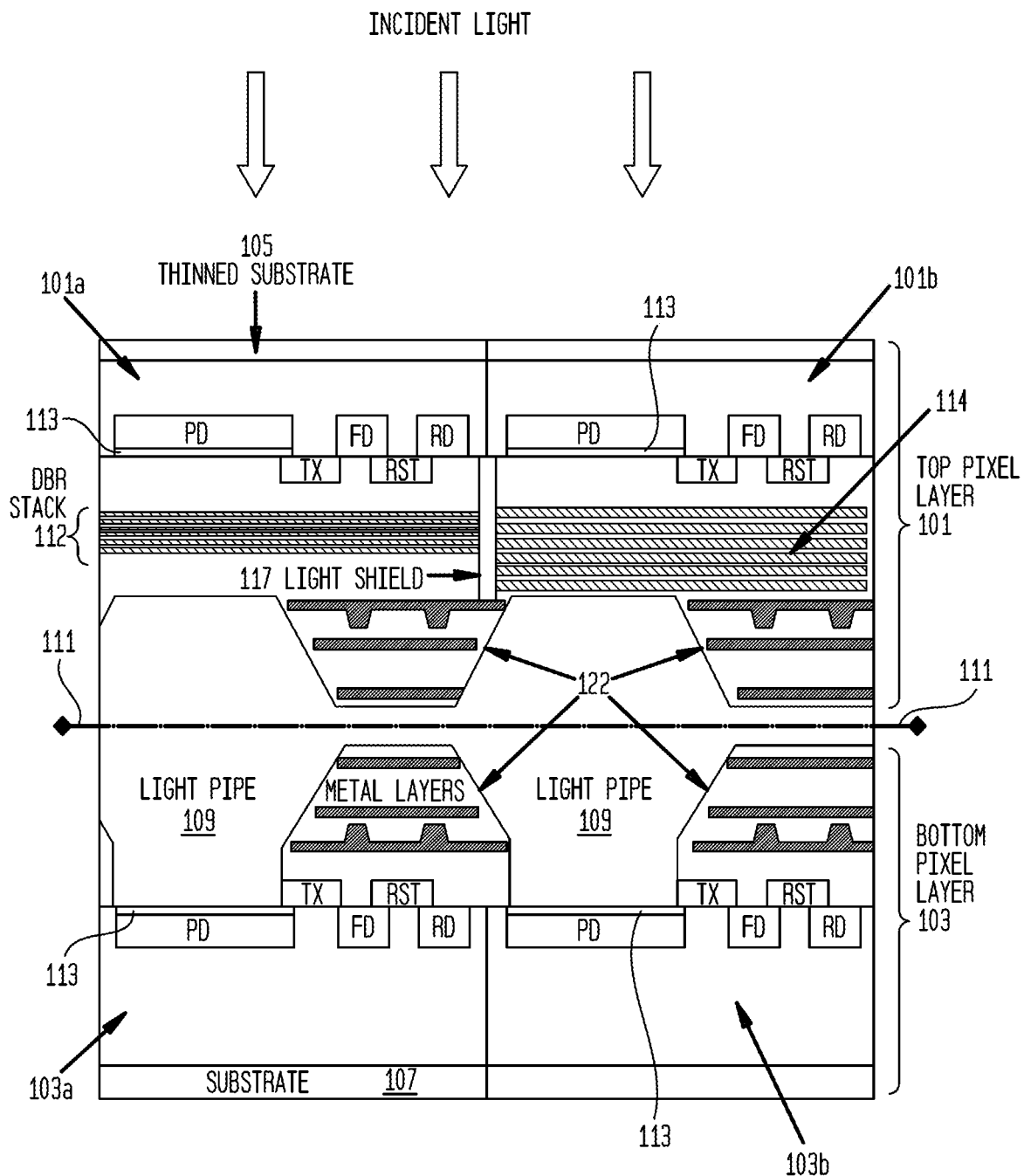
FIG. 7 depicts a cross-sectional view of two neighboring 2-layer pixels in accordance with an illustrative embodiment employing wafer bonding, in accordance with some embodiments of the present invention.

More particularly, the illustrative embodiment of FIG. 7 depicts a cross-sectional view of two neighboring 2-layer pixels in accordance with an illustrative embodiment employing wafer bonding. As shown, a top pixel layer 101 (corresponding to a first wafer with substrate 105, which may be thinned for backside illumination by light incident on the image sensor) comprises DBRs 112 and 114 in respective upper pixels 101a and 101b, and a bottom pixel layer 103 (corresponding to a second wafer with substrate 107) comprises underlying lower pixels 103a and 103b. Each pixel is shown as including a photodiode PD having a pinning dopant layer 113, a transfer gate TX, a floating diffusion FD, a reset gate RG, and a reset drain RD. Upper and lower pixel layers also include interconnect layers 122 that include conductive metallization (e.g., metal layers) and interlayer dielectrics. Also shown, by way of example, is a light shielding elements 117 that may be included to prevent or reduce optical cross-talk. As schematically illustrated, the two wafers are bonded at their front surfaces along wafer bonding plane 111, and configured to provide light pipes 109 to guide light from the upper photodiode to the lower photodiode. As will be understood by those skilled in the art, a further dielectric layer (e.g., which may comprise one or more layers) may be disposed on substrate 105 and is formed into an array of microlenses corresponding on a one microlens to one multilayer pixel (or, in some embodiments a one-to-many) basis with the multilayer pixels.

As will be understood in view of the present disclosure, FIG. 7 depicts a portion of an of image sensor, which may further include additional circuitry (not shown) outside the pixel array, such as row and column timing and driver circuitry, column sense amplifiers, and A/D converters, monolithically integrated (i.e., on the same chip) as part of image sensor. Also, as known to those skilled in the art, each pixel includes associated pixel circuitry, which may be configured in various ways (e.g., 4 T pixel, shared-readout circuitry, etc.) and may also include, for example, an amplifier (e.g., source-follower transistor), and a readout transistor.

And further, as noted, for purposes of clarity of exposition, FIG. 7 illustrates a cross-sectional portion of only two neighboring two-layer pixels of the pixel array portion of an image sensor, the illustrative cross section being along a vertical or horizontal direction of a pixel array and intersecting the photosensitive regions of the pixels.

It will also be understood, for example, that while FIG. 7 depicts an top pixel layer back-side illumination (BSI) configuration and a bottom pixel layer front-side illumination configuration, embodiments in accordance with the present disclosure are not limited as such, and may include any variation of FSI and BSI configured top and bottom wafers/layers.

Figure 8:
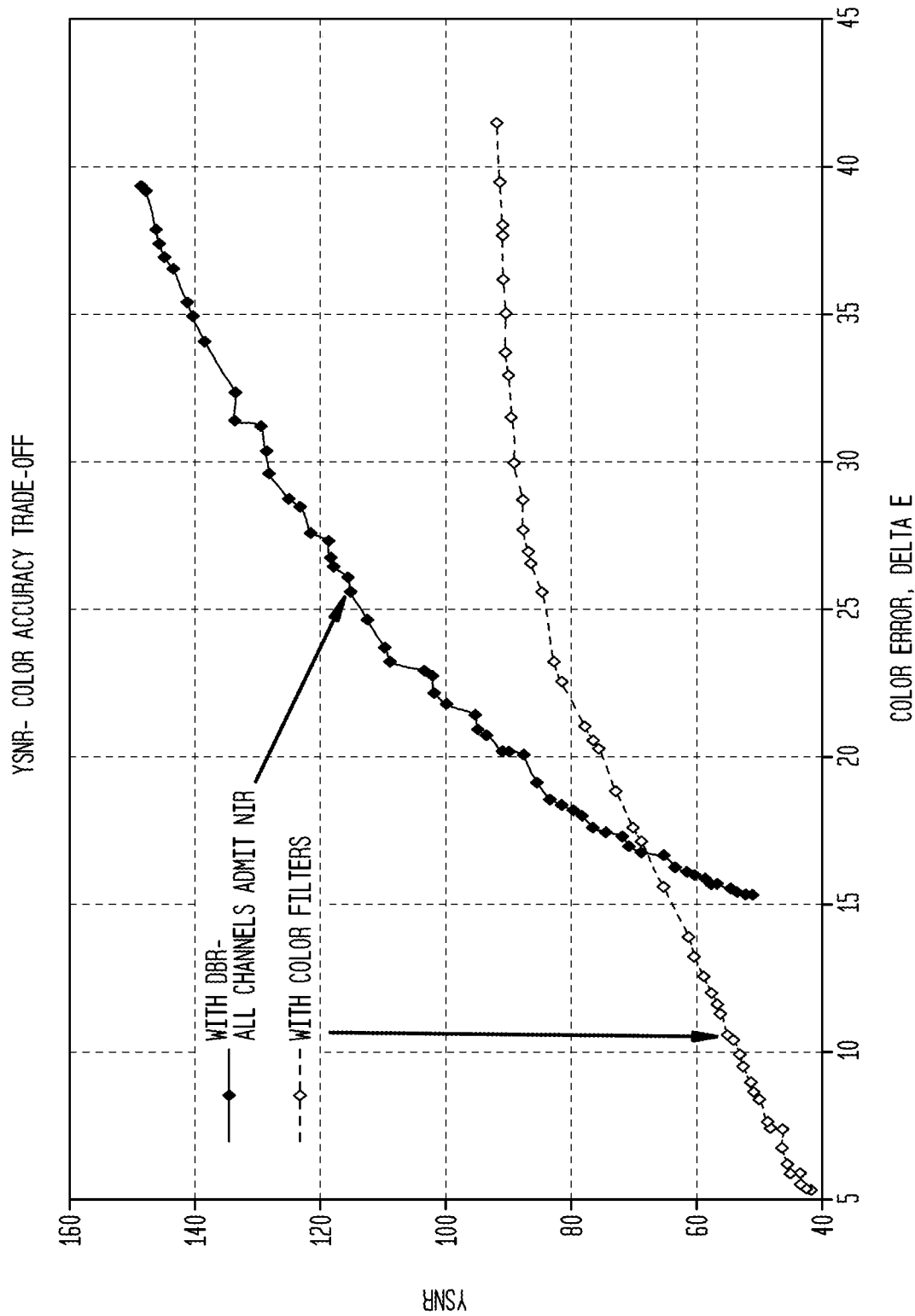
FIG. 8 depicts the result of a simulation evaluating the performance of an iteration of an illustrative embodiment in which no NIR filters are used, in accordance with some embodiments of the present invention.

In some embodiments of the present invention, at least one channel in each kernel can be designed to capture NIR light to improve sensitivity of the detector and hence its low light performance. Infra-red cut-off filters may be used to improve the color reproduction. Typically, these are used to reduce the corruption of the color signals by infrared light. An illustrative compromise between improving low light performance and maintaining good color reproduction is to capture NIR light only in some pixels in the kernel. Instead of having a NIR filter over all pixels in a kernel, some pixels can be left exposed to NIR light. This will increase signal collected in low light situations thus enhancing the signal-to-noise ratio. Shown in FIG. 8 is the result of a simulation evaluating the performance of an iteration of an illustrative implementation of the current invention in which no NIR filters were used. All channels admit NIR light. Simulations determined optimal color correction matrices for the best color and YSNR performance. In the figure shown below, the YSNR—Color Error relationship of our sample structure is compared to that of a conventional two layer pixel with Green and Magenta color filters.

It is evident that using the color filters produces the best color performance. Note, however, that when a sufficiently high color error is allowed, the two layer DBR pixels allowing NIR light have significantly higher YSNR than the conventional two layer pixels using absorption color filters.

The implementation of frequency dependent reflectors requires a few extra deposition steps which may increase costs. Color performance of some implementations of such an imager may also be worse than color reproduction obtained by using absorption color filters as is currently done because of the non-optimal color responses. However, each of various embodiments of the present invention enhances light collection and could greatly improve low light performance. In applications where color performance can be traded for YSNR improvement such as in security applications, this approach is an excellent alternative to the conventional methods.

It will be understood, for example, that kernels in accordance with the present disclosure are not limited to square multi-layer pixel arrays. In other words, in view of the present disclosure one skilled in the art will understand that multi-layer pixels having a FDR in accordance with the present disclosure are applicable to myriad image sensors and image sensor pixel configurations, and are not limited to or by the image sensor and pixel circuit configurations generally described herein for purposes of ease of reference and clarity of exposition.

Some aspects of the present invention have been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A color image sensor that comprises a plurality of multi-layer pixels, the color image sensor comprising:
   an array of kernels, each kernel comprising a plurality of multi-layer pixels; and
   wherein at least one multi-layer pixel in each kernel includes a dielectric frequency-dependent reflector disposed between and adjacent to an upper photoconversion layer and a lower photoconversion layer.

2. The color image sensor of claim 1, wherein at least two of the multi-layer pixels in the kernel have respective dielectric frequency-dependent reflectors having different respective reflectance characteristics.

3. The color image sensor of claim 1, wherein at least two of the multi-layer pixels in the kernel have respective dielectric frequency-dependent reflectors having substantially the same reflectance characteristics.

4. The color image sensor of claim 1, wherein at least three of the multi-layer pixels in the kernel have respective dielectric frequency-dependent reflectors having different respective reflectance characteristics.

5. The color image sensor of claim 1, wherein at least four of the multi-layer pixels in the kernel have respective dielectric frequency-dependent reflectors having different respective reflectance characteristics.

6. The color image sensor according to claim 1, wherein NIR filters are configured over some but not all of the pixels in the kernel to enhance color reproduction.

7. The color image sensor according to claim 1, wherein at least one NIR filter is configured over all of the pixels in the kernel to enhance color reproduction.

8. The color image sensor according to claim 1, wherein at least one channel corresponding to a multi-layer pixel collects NIR light for enhanced sensitivity.

9. The color image sensor according to claim 1, wherein each multi-layer pixel comprises an upper junction and a lower junction, and each upper junction is formed on a first wafer, each lower junction is formed on a second wafer, and wherein the first and second wafers are bonded to provide the color image sensor.

10. The color image sensor according to claims 1, wherein each multi-layer pixel comprises a first junction and a second junction that are realized on the same wafer such that the first junction is implanted and an epitaxial layer grown for the implantation of the second junction.

11. The color image sensor according to claim 1, wherein the color image sensor is a CMOS active pixel image sensor.

12. The color image sensor of claim 1, wherein each multi-layer pixel is a two-layer pixel.

13. The color image sensor of claim 1, wherein the kernel does not include a conventional absorption color filter.

14. The color image sensor of claim 1, wherein the frequency-dependent reflector is a distributed Bragg reflector.

15. A color image sensor comprising:
an array of kernels, the array extending over a plane parallel to an imaging plane of the color image sensor, each kernel comprising a plurality of pixels that includes at least one multi-layer pixel;
wherein each said at least one multi-layer pixel includes a plurality of photoconversion layers stacked along a direction perpendicular to the plane parallel to the imaging plane, or along a direction in which the color image sensor is configured for incident photons to impinge on the imaging plane, or both; and
wherein for each said at least one multi-layer pixel in each kernel, a respective dielectric photon-frequency-dependent reflector is disposed between adjacent ones of the plurality of photoconversion layers, such that the pixels in each kernel are configured to provide at least three color samples for light incident on the kernel.

16. The color image sensor according to claim 15, wherein each kernel includes a plurality of the multi-layer pixels, the multi-layer pixels in each kernel being disposed at different positions with respect to the plane parallel to the imaging plane.

17. The color image sensor according to claim 15, wherein each of the photoconversion layers extend along a plane parallel to the imaging plane.

18. The color image sensor of claim 15, wherein each multi-layer pixel is a two-layer pixel.

19. The color image sensor of claim 15, wherein the kernel does not include a conventional absorption color filter.

20. The color image sensor of claim 15, wherein the photon-frequency-dependent reflector is a distributed Bragg reflector.

* * * * *